(12) United States Patent
Müller et al.

(10) Patent No.: US 7,230,442 B2
(45) Date of Patent: Jun. 12, 2007

(54) SEMI-CONDUCTOR COMPONENT TESTING PROCESS AND SYSTEM FOR TESTING SEMI-CONDUCTOR COMPONENTS

(75) Inventors: Georg Müller, München (DE); Michael Kund, Tuntenhausen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/860,594

(22) Filed: Jun. 4, 2004

(65) Prior Publication Data

US 2005/0017747 A1   Jan. 27, 2005

(30) Foreign Application Priority Data

Jun. 5, 2003   (DE) ................. 103 26 338

(51) Int. Cl.
*G01R 31/02* (2006.01)
*G01R 31/26* (2006.01)

(52) U.S. Cl. ............ 324/765; 324/759; 324/764; 324/158.1

(58) Field of Classification Search ........ 324/765, 324/754, 158.1, 758, 72.5, 760; 438/14–18; 714/719, 720, 724; 209/573, 571, 574
See application file for complete search history.

(56) References Cited

U.S. PATENT DOCUMENTS 5,465,850 A * 11/1995 Kase .............. 209/573
6,137,303 A * 10/2000 Deckert et al. ........ 324/765
6,204,679 B1 * 3/2001 Gray, III ............ 324/760
6,563,331 B1 * 5/2003 Maeng ............. 324/760
6,732,053 B1 * 5/2004 Aragona ............ 702/22
6,809,510 B2 * 10/2004 Goetzke ............ 324/158.1

OTHER PUBLICATIONS

Walker, John, "The Analytical Engine, Table of Contents," www.fourmilab.ch/babbage/contents.html, pp. 1-6, Jun. 18, 2004.
Walker, John, The Analytical Engine, The First Computer, www.fourmilab.ch/babbage, pp. 1-3, Jun. 18, 2004.
Menabrea, L.F., "Sketch of The Analytical Engine Invented by Charles Babbage," www.fourmilab.ch/babbage/sketch.html pp. 1-50, Jun. 21, 2004.
Babbage, C., "The Analytical Engine, Passages from the Life of a Philosopher," www.fourmilab.ch/babbage/contents.html, pp. 1-16, Jun. 18, 2004.
Cayley et al., "The Analytical Engine," www.fourmilab.ch/babbage/baas.html, pp. 1-11, Jun. 18, 2004.
H.P. Babbage, "The Analytical Engine," www.fourmilab.ch/babbage/hpb.html, pp. 1-10, Jun. 18, 2004.

(Continued)

*Primary Examiner*—Ha Tran Nguyen
*Assistant Examiner*—Emily Y Chan
(74) *Attorney, Agent, or Firm*—Morrison & Foerster LLP

(57) ABSTRACT

The invention involves a semi-conductor component testing process, and a system for testing semi-conductor components, in which a central computer device, in particular a central test apparatus is provided, with which test result data obtained from at least two separate tests is jointly evaluated, in particular by means of an appropriate pattern recognition process, which incorporates the test result data obtained from the separate tests into the analysis.

4 Claims, 3 Drawing Sheets

OTHER PUBLICATIONS

H.P. Babbage, "The Analytical Engine," Babbage's Analytical Engine, www.fourmilab.ch/babbage/hpb1910.html, pp. 1-5, Jun. 18, 2004.

The Analytical Engine, "Pascal's Calculating Machine (1645)," www.fourmilab.ch/babbage/pascal.html, pp. 1-9, Jun. 18, 2004.

Walker, J., "The Analytical Engine," Glossary, www.fourmilab.ch/babbage/glossary.html, pp. 1-3, Jun. 18, 2004.

"The Analytical Engine: Is the Emulator Authentic?," www.fourmilab.ch/babbage/authentic.html, pp. 1-9, Jun. 18, 2004.

* cited by examiner

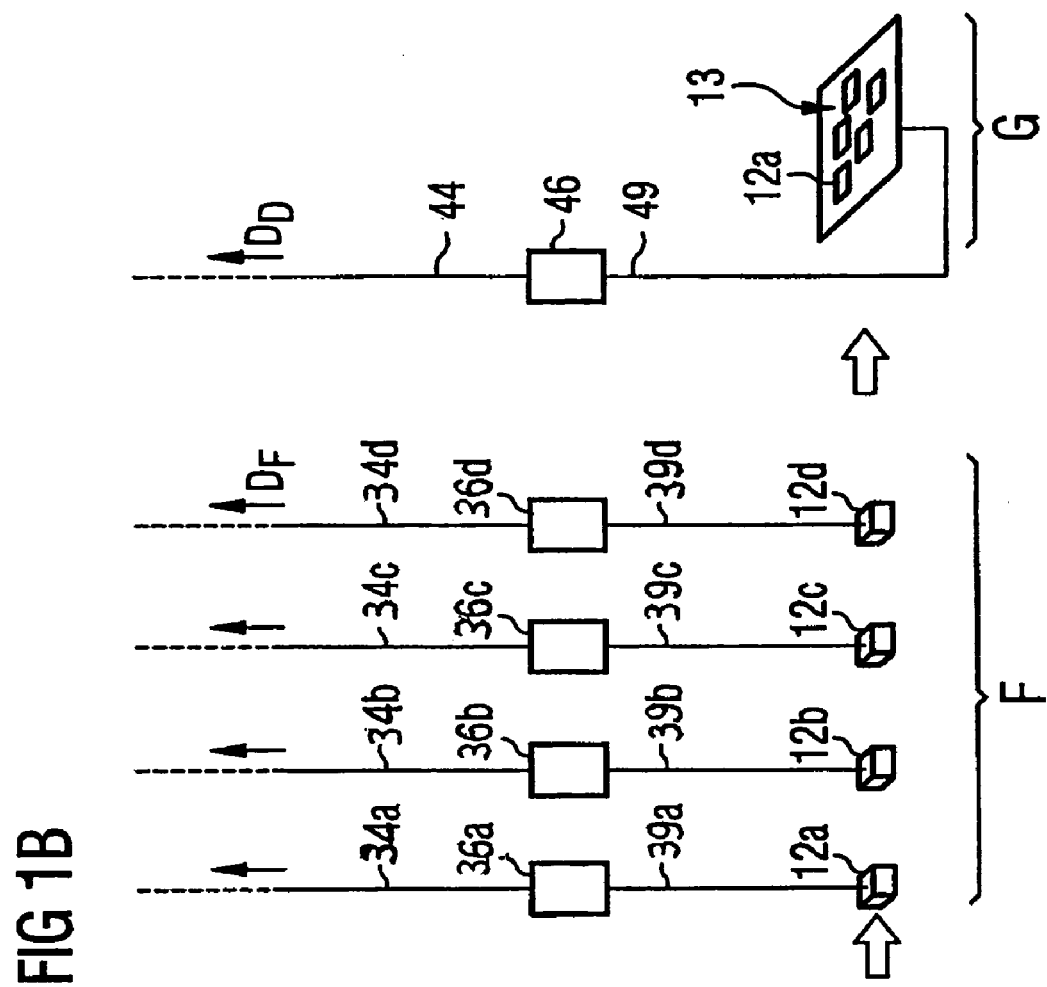

SEMI-CONDUCTOR COMPONENT TESTING PROCESS AND SYSTEM FOR TESTING SEMI-CONDUCTOR COMPONENTS

CLAIM FOR PRIORITY

This application claims the benefit of priority to German Application No. 103 26 338.1, filed in the German language on Jun. 5, 2003, the contents of which are hereby incorporated by reference.

TECHNICAL FIELD OF THE INVENTION

The invention involves a semi-conductor component testing process and a system for testing semi-conductor components, and in particular, a test system with data fusion and automated pattern recognition for process control and fault analysis in integrated circuits.

BACKGROUND OF THE INVENTION

Semi-conductor components, for instance corresponding integrated (analog and/or digital) computer circuits, semi-conductor memory components, for instance functional memory components (PLAs, PALs, etc.) and table memory components (e.g. ROMs or RAMs, in particular SRAMs and DRAMs) are subjected to extensive testing during the manufacturing process.

For the simultaneous, combined manufacture of numerous (generally identical) semi-conductor components, a so-called wafer (i.e. a thin disk of monocrystalline silicon) is used. The wafer is appropriately treated (for instance subjected in succession to numerous coating, exposure, etching, diffusion and implantation process steps, etc.), and then for instance sliced up (or scored and snapped off), so that the individual components become available.

During the manufacture of semi-conductor components (for instance DRAMs (Dynamic Random Access Memories and/or dynamic read-write memories), in particular of DDR-DRAMs (Double Data Rate—DRAMs and/or DRAMs with double data rate)) semi-completed components (still on the wafer) can be subjected—even before the above process steps required for the wafer have been completed (i.e. even while the semi-conductor components are still in a semi-complete state), to appropriate test processes at one or more test stations (for instance the so-called kerf measurements at the wafer scoring frame) with the aid of one or more testing apparatuses.

After completion, (i.e. after completion of all the above wafer processing steps) the semi-conductor components are subjected to further test procedures at one or more (further) test stations—completed components can for instance be appropriately tested with the aid of corresponding (additional) test equipment ("slice tests").

After the wafers have been sliced up (and/or scored and snapped off), the—individually available—components are then each loaded onto a so-called carrier (i.e. a suitable mounting), whereupon the semi-conductor components—loaded onto the carrier—can be subjected to one or several (further) test procedures corresponding with other test stations.

In the same way, one or more further tests (at corresponding test stations and with the use of appropriate additional test equipment) can be performed, for instance after the semi-conductor components have been mounted onto the corresponding semi-conductor component housing, and/or for instance after the semi-conductor component housing (together with the semi-conductor components mounted onto it in each case) has been mounted (for so-called module tests) into a corresponding electronic module.

While testing the semi-conductor components, the so-called "DC test" and/or for instance the so-called "AC test" may be applied as a test procedure (for instance for the above slice tests, module tests, etc.) in each case.

For the DC test for instance, a particular voltage (or current)—at a certain fixed level—can be applied to the appropriate connection of a semi-conductor component to be tested, whereafter the level of the—resulting—current (and/or voltage) can be measured—in particular to ascertain whether this current (and/or voltage) falls within certain predetermined desired critical limits.

During an AC test in contrast, voltages (or currents)—in particular appropriate test sample signals—at varying levels can for instance be applied to the appropriate connections of a semi-conductor component, with the aid of which appropriate function tests can be performed on each corresponding semi-conductor component.

With the help of the above test procedures defective semi-conductor components can be identified and removed (or possibly even repaired).

Furthermore the results obtained in the above tests can for instance also be used to improve and/or optimize the process steps applied during the manufacture of the semi-conductor components (for instance the coating, exposure, etching, diffusion and/or implantation process steps, etc.) thereby improving the yield of such semi-conductor components during manufacture.

In order to achieve this, an attempt must be made to ascertain from the results obtained in the above tests what the—physical—causes of any possibly occurring faults may be.

This is generally done manually—in conventional processes—and usually always by—individually—examining the results obtained from each of the above tests.

Such a—manual—evaluation of test results for improved/optimized yield is time-consuming and expensive and often leads to unsatisfactory results.

SUMMARY OF THE INVENTION

This invention discloses a semi-conductor component testing process and a testing system for testing semi-conductor components.

In one embodiment of the invention, there is a system for testing semi-conductor components, whereby a—in particular a central—computer device, more particularly a—in particular a central—test apparatus is provided, with which test results obtained from at least two different tests can be simultaneously evaluated.

This evaluation can be advantageously done by using a pattern recognition process—with the appropriate test data results obtained from the various tests also incorporated into the analysis.

BRIEF DESCRIPTION OF THE DRAWINGS

The invention is described below with reference to the embodiments and the attached Figures. In the Figures:

FIG. 1b shows further stations that are passed through during the manufacture of corresponding semi-conductor components, and several further test apparatuses forming part of the semi-conductor component testing system.

DETAILED DESCRIPTION OF THE INVENTION

Figure 1A:
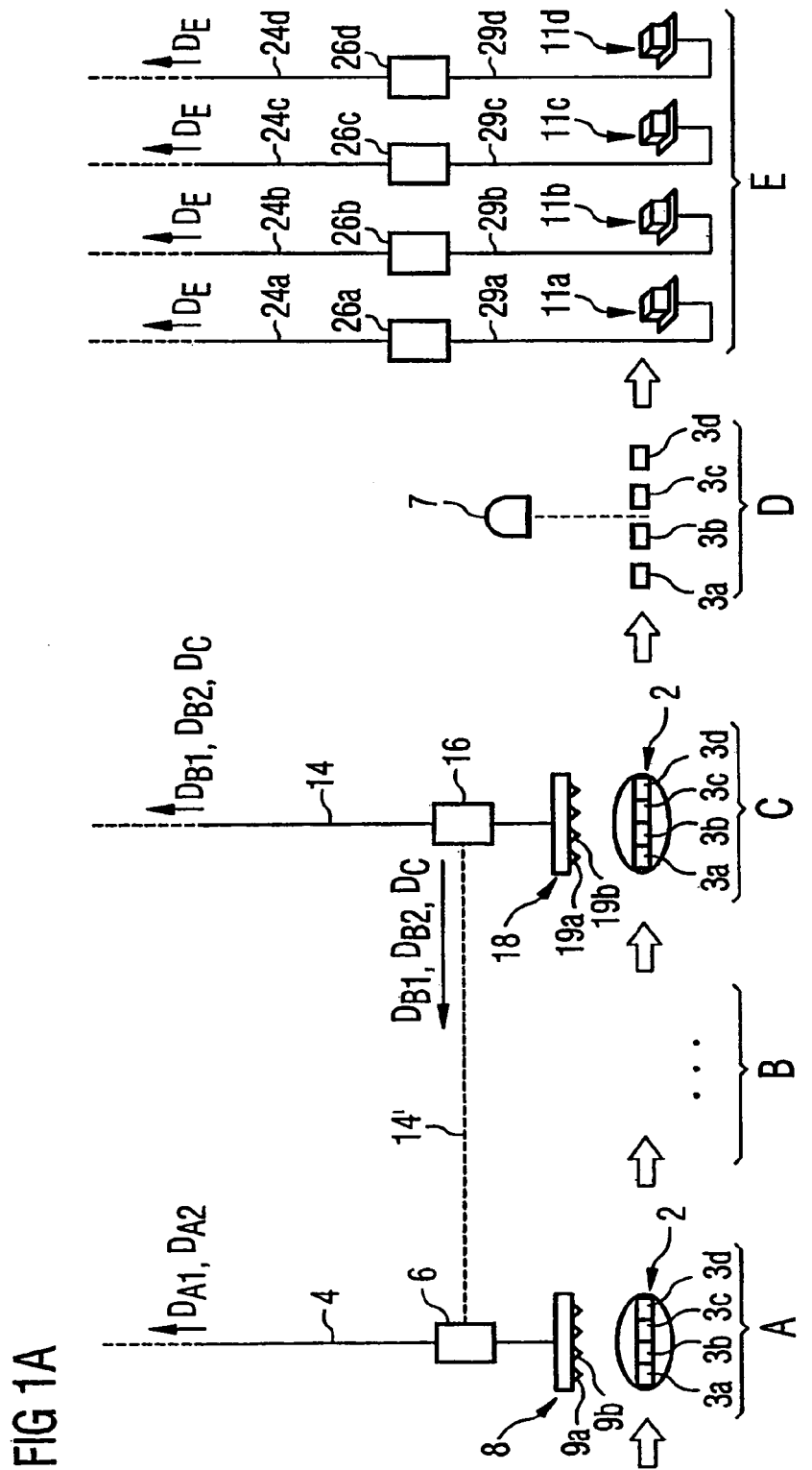
FIG. 1a shows stations passed through during the manufacture of corresponding semi-conductor components, and of several test apparatuses forming part of a semi-conductor component testing system according to one embodiment of the invention.

In FIGS. 1a and 1b, several stations A, B, C, D, E, F, G (some of several further stations not shown here) passed through by the corresponding semi-conductor components 3a, 3b, 3c, 3d during the manufacture of the semi-conductor components 3a, 3b, 3c, 3d (and/or electronic modules) are—schematically—represented.

The semi-conductor components 3a, 3b, 3c, 3d may for instance be corresponding integrated (analog and/or digital) computer circuits, and/or semi-conductor memory components, for instance functional memory components (i.e. PLAs, PALs, etc.), and table memory components, (for instance ROMs or RAMs), in particular SRAMs or DRAMs (here for instance DRAMs (Dynamic Random Access Memories and/or Dynamic Read-Write Memories) with double data rate (DDR DRAMs=Double Data Rate—DRAMs), preferably high-speed DDR DRAMs).

During the manufacture of the semi-conductor components 3a, 3b, 3c, 3d, an appropriate silicon disk or an appropriate wafer 2 is correspondingly subjected to conventional coating, exposure, etching, diffusion, and/or implantation process steps, etc.—for instance at the stations—not shown here—placed in series upstream and downstream from the station A shown in FIG. 1a (for instance, station B placed after station A—as well as numerous further stations (placed before and after station A).

Station A serves to subject the semi-conductor components 3a, 3b, 3c, 3d—still present on wafer 2—to one or more test procedures by means of a test apparatus 6—for instance so-called kerf measurements at the wafer scoring frame—(in fact—as is apparent from the embodiment examples above—even before all the process steps required for wafer 2 above have been completed (i.e. already during the half-completed state of the semi-conductor components 3a, 3b, 3c, 3d).

The voltages/currents and/or test signals required at station A for testing the semi-conductor components 3a, 3b, 3c, 3d on wafer 2, are generated by the test apparatus 6, and fed to corresponding connections of the semi-conductor components 3a, 3b, 3c, 3d by means of the semi-conductor component test card 8, which is connected to the test apparatus 6 (more precisely: by means of corresponding contact pins 9a, 9b provided on the test card 8).

From station A, wafer 2 is (in particular fully automatically) transported to station B (and from there possibly to numerous further stations—not shown here), where—as already mentioned above—wafer 2 is subjected to further appropriate further process steps (in particular to appropriate coating, exposure, etching, diffusion, and/or implantation process steps, etc.), and/or to further test procedures—correspondingly similar to those applied at station A.

After the semi-conductor components have been manufactured (i.e. after all the above wafer processing steps have been performed), wafer 2 is transported from the corresponding—previous—processing station (for instance from station B, or other further—downstream-stations)—in particular completely automatically—to the next station C.

Station C serves to subject the semi-conductor components 3a, 3b, 3c, 3d—completed and still present on the wafer 2—to one or more—further—test procedures (for instance so-called slice tests) by means of a test apparatus 16.

The voltages/currents and/or test signals required at station C for testing the semi-conductor components 3a, 3b, 3c, 3d on the wafer 2, are generated by test apparatus 16, and fed by means of a semi-conductor component test card, 18 connected to the test apparatus 16, to the corresponding connections of the semi-conductor components 3a, 3b, 3c, 3d (more precisely: by means of corresponding contact pins 19a, 19b provided on test card 18).

From station C wafer 2 is (in particular fully automatically) transported to the next station D, where (after wafer 2 has had foil glued to it in a recognized fashion) it is sliced up by means of an appropriate machine 7 (or for instance scored and snapped off), so that the semiconductor components 3a, 3b, 3c, 3d then become—individually—available.

Before being transported to station D, wafer 2—and/or the components 3a, 3b 3c, 3d present on it—may be subjected to one or more further test procedures at one or several stations corresponding with station C.

After wafer 2 has been sliced up at station D, each individual component 3a, 3b, 3c, 3d is then (in particular—again—fully automatically) loaded into an appropriate carrier 11a, 11b, 11c, 11d and/or holder 11a, 11b, 11c, 11d, whereafter the semi-conductor components 3a, 3b, 3c, 3d—loaded into carriers 11a, 11b, 11c, 11d—are transported to one or several (further) test stations—for instance to the station E shown in FIG. 1a—and subjected to one or more further test procedures (for instance to the so-called carrier test).

For this, the carriers 11a, 11b, 11c, 11d are inserted into a corresponding carrier socket and/or carrier adapter—which are connected to one (or more) corresponding test apparatus(es) 26a, 26b, 26c, 26d via corresponding lines 29a, 29b, 29c, 29d.

The voltages/currents and/or test signals required at station E for testing the semi-conductor components 3a, 3b, 3c, 3d in the carriers 11a, 11b, 11c, 11d, are generated by the test apparatus(es) 26a, 26b, 26c, 26d, and fed to corresponding connections on the semi-conductor components 3a, 3b, 3c, 3d via the carrier socket connected via the lines 29a, 29b, 29c, 29d to the test apparatus(es) 26a, 26b, 26c, 26d, and to the carriers 11a, 11b, 11c, 11d connected to them.

From station E the semi-conductor components 3a, 3b, 3c, 3d are further transported (in particular completely automatically) to one or more station(s)—not shown here—where the semi-conductor components 3a, 3b, 3c, 3d are mounted into the corresponding housings 12a, 12b, 12c, 12d (for instance corresponding plug-in or surface-mounted component housings, etc.).

As shown in FIG. 1b, the semi-conductor components 3a, 3b, 3c, 3d—mounted into housings 12a, 12b, 12c, 12d—are then further transported to one (or more) further test stations—for instance to the station F shown in FIG. 1b—and subjected to one or more further test procedures there.

For this, the semi-conductor component housings 12a, 12b, 12c, 12d are inserted into corresponding component housing sockets and/or component housing adapters connected—via corresponding lines 39a, 39b, 39c, 39d—with one (or more) corresponding test apparatus(es) 36a, 36b, 36c, 36d.

The voltages/currents and/or test signals required at station F for testing the semi-conductor components 3a, 3b, 3c, 3d—mounted in the housing 12a, 12b, 12c, 12d—are generated by the test apparatus(es) 36a, 36b, 36c, 36d and fed via the lines 39a, 39b, 39c, 39d connected to the housing sockets and the test apparatus(es) 36a, 36b, 36c, 36d, and the component housings 12a, 12b, 12c, 12d connected to it, to corresponding connections on the semi-conductor components 3a, 3b, 3c, 3d.

From station F the semi-conductor components 3a, 3b, 3c, 3d mounted in the housing 12a, 12b, 12c, 12d can then—optionally—be transported to one or more further station(s)—not shown here—where a corresponding semi-conductor component housing (for instance the housing 12a, with the semi-conductor component 3a mounted in it)—together with further components (analog and/or digital computer circuits, and/or semi-conductor memory components, for instance PLAs, PALs, ROMs, RAMS, in particular SRAMs or DRAMs, etc.)—is connected to a corresponding electronic module 13—for instance a circuit board.

As shown in FIG. 1b, the electronic module 13 (and thereby also the semi-conductor components 3a (mounted in a corresponding housing 12a)—connected to the electronic module 13) can then—optionally—be transported further to one (or more) further test stations—for instance the station G shown in FIG. 1b—and there subjected to one or more further test procedures (in particular so-called module tests).

The voltages/currents and/or test signals required at station G for testing the module 13 (and thereby also the semi-conductor component 3a mounted in it) are for instance generated by a test apparatus 46, and fed via a line 49 to the electronic module 13, and thereby also to the corresponding connections of the corresponding semi-conductor components 3a mounted on it.

The above test procedures required for testing the semi-conductor components 3a, 3b, 3c, 3d (for instance at station A, and/or station C, and/or station E, and/or station F, and/or station G, and/or further stations not shown here) and/or those required for the test apparatus 6 and/or 16, and/or the test apparatuses 26a, 26b, 26c, 26d and/or 36a, 36b, 36c, 36d, and/or the test apparatus 46, and/or corresponding further test procedures—not shown in the illustrations—performed by test apparatuses (kerf measurements, slice tests, carrier tests, module tests, etc.)—may involve the so-called DC-tests, and/or for instance the so-called AC-tests (whereby for instance in each case a DC or an AC test, or for instance both a DC as well as an AC test, or—in particular under varying test conditions—several DC and/or several AC tests, can be performed at each of the above stations A, C, E, F, G—and/or corresponding stations not shown here—and/or by each of the above test apparatuses 6, 16, 26b, 26c, 26d, 36a, 36b, 36c, 36d, 46—and/or test apparatuses corresponding to them and not shown here).

Figure 1C:
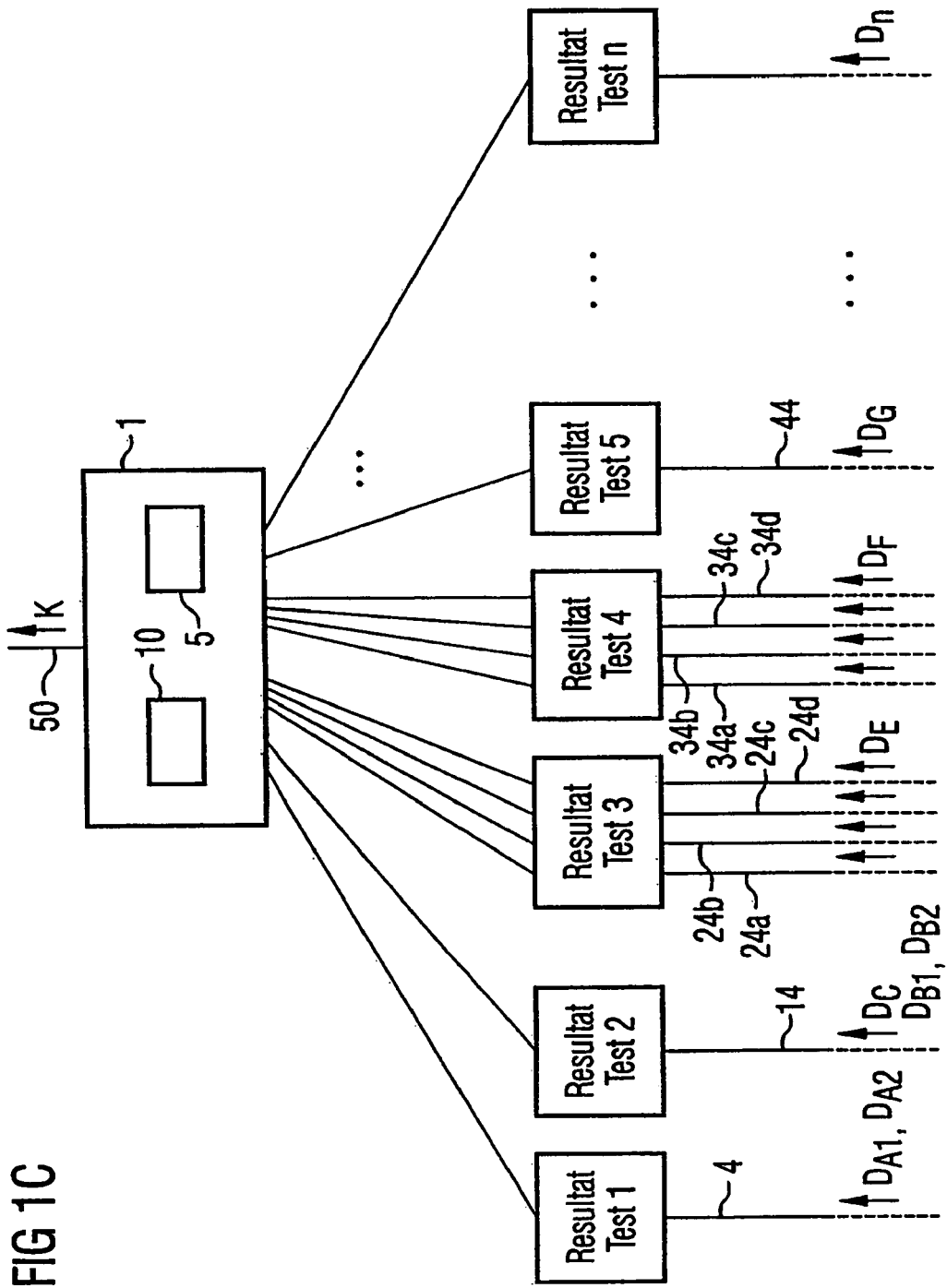
FIG. 1c shows a central computer installation—forming part of the semi-conductor component testing system—with which—as an alternative to a central test apparatus—data derived from the test system can be processed.

In a DC test, a voltage (or current) at a specific—constant—level can for instance be fed by a corresponding test apparatus 6, 16, 26b, 26c, 26d, 36a, 36b, 36c, 36d, 46 to a corresponding connection of the semi-conductor components 3a, 3b, 3c, 3d to be tested, whereafter the levels of the resulting currents (and/or voltages) can be measured, and then evaluated by the corresponding test apparatuses 6, 16, 26b, 26c, 26d, 36a, 36b, 36c, 36d, 46—and for instance by each test apparatus 6, 16, 26b, 26c, 26d, 36a, 36b, 36c, 36d, 46, and/or—alternatively—by a (central) computer installation—shown in FIG. 1c (in particular for instance by testing whether these currents (and/or voltages) lie within predetermined desired critical limits (the (single) fault test), and/or in another special fashion—as more closely described below).

In contrast, in an AC test of the corresponding test apparatus 6, 16, 26b, 26c, 26d, 36a, 36b, 36c, 36d, 46, voltages (or currents) at varying levels can for instance be applied at the corresponding connections of the semi-conductor components 3a, 3b, 3c, 3d to be tested—in particular corresponding test signals, for instance test sample signals (i.e. a corresponding signal sequence and/or test pattern), with the help of which appropriate function and/or functionality tests can be performed at each semi-conductor component (for instance by detecting signals—in particular signal sequences generated by the semi-conductor component in response to the applied test signal—generated by the corresponding test apparatus 6, 16, 26a, 26b, 26c, 26d, 36a, 36b, 36c, 36d, 46, and for instance evaluated by each of the test apparatuses 6, 16, 26a, 26b, 26c, 26d, 36a, 36b, 36c, 36d, 46, and/or—alternatively—by the (central) computer installation 1 shown in FIG. 1c (in particular for instance by testing whether the resulting signal sequences correspond with expected model signals, in particular model signal sequences (the (single) fault test), and/or in another special fashion—described more closely below).

In the embodiment example shown here, several, in particular several different AC and/or DC tests can be performed by one and the same test apparatus 6, 16, 26a, 26b, 26c, 26d, 36a, 36b, 36c, 36d, 46—for one and the same component 3a, and/or one and the same group of components, and/or for one and the same wafer 2, and/or for one and the same batch, etc.—in particular several AC and/or DC tests can be performed under different test conditions in each case, (for instance several DC tests, each with varying levels of voltages (or currents) applied to the particular semi-conductor component, and/or several DC tests using voltages (or currents), applied in each case to different component connections, and/or several AC tests using different test signals in each case, in particular test patterns, and/or by using different component connections for signal input in each case, and/or by using different external and/or internal voltage and/or signal levels in each case, etc., etc.).

In alternative embodiment examples—not shown here—the above test apparatuses 6, 16, 26a, 26b, 26c, 26d, 36a, 36b, 36c, 36d, 46 can be—wholly or partly—dispensed with; the corresponding voltages (or currents), and/or test signals to be applied at corresponding connections of the semi-conductor components 3a, 3b, 3c, 3 to be tested, for instance for performing AC and/or DC tests, can then be—wholly or partly—generated by the above (central) computer installation 1.

As is apparent from FIG. 1c, the (central) computer installation 1, functioning as a (central) test evaluation installation—here (as an alternative to, for instance, a corresponding test apparatus, for instance to the test apparatus 6 (see below))—correspondingly similar to conventional computers, in particular to PCs, work stations, or server computers—has one or more memory devices 10, as well as one or more processor devices, in particular one or more micro processors 5.

In alternative embodiment examples not shown here, the function of the computer installation 1 shown in FIG. 1c can also be performed by several—decentralized—coordinated computers.

Alternatively, the function of the computer installation 1, can for instance also (as already indicated above) be performed by one—or several—of the above test apparatuses 6, 16, 26a, 26b, 26c, 26d, 36a, 36b, 36c, 36d, 46, (for instance by the test apparatus 6).

As is apparent from FIGS. 1a, 1b and 1c in the embodiment example shown here—in contrast to state-of-the-art technology—the data (for instance the data $D_{A1}$, $D_{B1}$) obtained by one and the same test apparatus 6 during—separate—tests (for one and the same component 3a, and/or for one and the same group of components 3a, 3b, 3c, 3d, and/or for one and the same wafer 2, and/or for one and the same batch) and/or the data obtained from—separate—tests (for one and the same component 3a, and/or for one and the same group of components 3a, 3b, 3c, 3d, and/or for one and the same wafer 2, and/or for one and the same batch) from various different test apparatuses 6, 16, 26a, 26b, 26c, 26d, 36a, 36b, 36c, 36d, 46 (for instance the data $D_{A1}$, $D_{A2}$, and/or the data $D_{B1}$, $D_{B2}$, and/or the data $D_C$, and/or $D_D$, and/or $D_E$, and/or $D_F$, (in particular the level of currents (and/or voltages)—arising in reaction to the voltages (and/or currents) applied to corresponding semi-conductor components, and/or the above signal emitted by corresponding semi-conductor components—in reaction to the test signal applied—in particular signal sequences (and/or the corresponding signal scanning values), etc.)) can be jointly evaluated, for instance by a corresponding test apparatus 6, 16, 26a, 26b, 26c, 26d, 36a, 36b, 36c, 36d, 46 (for instance the test apparatus 6), or for instance (alternatively)—as shown in FIG. 1c as an example—by the computer installation 1.

For this, the data is fed to $D_{A1}$, $D_{B1}$, $D_{A2}$, $D_{B2}$, $D_C$, $D_D$, $D_E$, $D_F$ at the corresponding test apparatus 6, or for instance to the computer installation 1, and stored there (for instance in the above computer installation memory device 10, or for instance in a corresponding memory device of the corresponding test apparatus 6).

For transferring the data $D_{A1}$, $D_{B1}$, $D_{A2}$, $D_{B2}$, $D_C$, $D_D$, $D_E$, $D_F$, the test apparatuses 6, 16, 26a, 26b, 26c, 26d, 36a, 36b, 36c, 36d, 46 can be connected to the (central) computer installation 1, for instance via the corresponding—separate—data connections 4, 14, 24a, 24b, 24c, 24d, 34a, 34b, 34c, 34d, 44, for instance via corresponding—line—connections, i.e. the corresponding lines 4, 14, 24a, 24b, 24c, 24d, 34a, 34b, 34c, 34d, 44, or alternatively for instance via corresponding—wireless—connections and/or—alternatively—to the above—(and/or alternative to the test apparatus 6 used for jointly evaluating the data (for instance via the data connection 14' shown in FIG. 1a by a broken line, as well as further data connections—not shown here—between the individual test apparatuses 6, 16, 26a, 26b, 26c, 26d, 36a, 36b, 36c, 36d, 46)).

The joint evaluation of the data $D_{A1}$, $D_{B1}$, $D_{A2}$, $D_{B2}$, $D_C$, $D_D$, $D_E$, $D_F$—derived from various tests—in the computer installation 1 (and/or alternatively: in a test apparatus, for instance the test apparatus 6), is automated, in particular performed in a fully automatic fashion.

Thereby the data $D_{A1}$, $D_{B1}$, $D_{A2}$, $D_{B2}$, $D_C$, $D_D$, $D_E$, $D_F$ obtained by the computer installation 1 (and/or alternatively: by the test apparatus 6) from at least two (in particular three or more) different tests (for instance several DC tests by the same test apparatus 6, or by several test apparatuses 6, 16, and/or several AC tests by the same test apparatus 6, or by several test apparatuses 6, 16, etc., etc.) is examined with regard to possible correlations and/or interrelations and/or patterns arising in this data, in particular—as is more closely described below—regarding correlations and/or interrelations and/or patterns between and/or with the data $D_{A1}$, $D_{B1}$, $D_{A2}$, $D_{B2}$, $D_C$, $D_D$, $D_E$, $D_F$, indicating a higher incidence of possible faults or failures in the tested semi-conductor components.

For this, the computer installation 1 (and/or alternatively: the test apparatus 6) can act correspondingly as a pattern recognition system, in particular for instance as a neural network.

For instance, a programmed pattern recognition software program, similar to conventional pattern recognition software programs—in particular a neural network software program—can be stored in the above computer installation memory device 10 (and/or alternatively: in a test apparatus memory device)—or any other further memory device.

Because of the large amount of data to be processed by computer installation 1 (and/or the test apparatus 6), the above pattern recognition can be performed by hardware—and not software—for instance by means of a signal processing chip, for instance an ASICS—correspondingly arranged and installed for instance in the computer installation 1 (and/or the test apparatus 6), etc.

The pattern recognition system created by the computer installation 1 (and/or alternatively: by the test apparatus 6) is "trained" during a first phase ("learning phase"—in particular before actually starting to manufacture components, for instance before and/or during the introduction of new component technology) by the—joint—use of the above data $D_{A1}$, $D_{B1}$, $D_{A2}$, $D_{B2}$, $D_C$, $D_D$, $D_E$, $D_F$ (and/or required parts of it), whereby the data $D_{A1}$, $D_{B1}$, $D_{A2}$, $D_{B2}$, $D_C$, $D_D$, $D_E$, $D_F$ (and/or required parts of it)—as mentioned above—may on occasion also be examined for correlations and/or interrelations and/or patterns, indicating an increased likelihood of faults and/or failures in the tested semi-conductor components 3a, 3b, 3c, 3d.

For this, the computer installation 1 (and/or alternatively: the test apparatus 6)—for instance of one of the above test apparatuses 6, 16, 26a, 26b, 26c, 26d, 36a, 36b, 36c, 36d, 46, can be—manually—provided with additional data $D_G$, in particular for instance appropriate fault analysis data $D_G$, which indicate whether a corresponding semi-conductor component 3a, 3b, 3c, 3d—for instance during a final control (and/or during one or more of the above (single) fault tests)—has been tested as faulty or fault-free, and/or which fault exactly has occurred in each case, etc.

Each individual data value of the above data $D_{A1}$, $D_{B1}$, $D_{A2}$, $D_{B2}$, $D_C$, $D_D$, $D_E$, $D_F$ (and/or each individual test value (current, voltage, kerf parameters, etc.)) creates a "feature" to be used in pattern recognition.

The different "features"—used for pattern recognition—and/or data $D_{A1}$, $D_{B1}$, $D_{A2}$, $D_{B2}$, $D_C$, $D_D$, $D_E$, $D_F$ used for tests always relating for instance to a particular tested semi-conductor component 3a (and/or a particular tested group of semi-conductor components 3a, 3b, 3c, 3d, a particular tested wafer 2, a particular tested batch, etc.)—cover a so-called pattern recognition feature vector in the pattern recognition feature area (for instance n features examined during pattern recognition, and/or n bits of data examined during pattern recognition (relating in each case to a particular tested semi-conductor component, wafer, batch, etc.) are combined to create an n-dimensional feature vector).

During the above learning phase the above pattern recognition system in each case investigates several such corresponding (for instance n-dimensional) feature vectors (whereby—as mentioned—each individual vector relates to a particular tested semi-conductor component 3a (and/or a particular tested group of semi-conductor components 3a, 3b, 3c, 3d, a particular tested wafer 2, a particular tested batch, etc.) (and/or to the corresponding test relating to them)—and each of the above feature vectors correspondingly relates to—for instance sequentially tested—semi-conductor components (and/or groups of sequentially tested semi-conductor components, wafers, etc.).

In other words, in the embodiment examples shown here, the above tests—and/or their corresponding tests (performed under corresponding conditions)—are performed in succession on several different semi-conductor components (and/or various groups of semi-conductor components, wafers, etc.), whereby a pattern recognition feature vector—in each case corresponding with the above—for instance n-dimensional—pattern recognition feature vector (with the corresponding features and/or data $D_{A1}$, $D_{B1}$, $D_{A2}$, $D_{B2}$, $D_C$, $D_D$, $D_E$, $D_F$) is determined.

The pattern recognition feature vectors are examined by the above pattern recognition system—for instance by making appropriate comparisons between individual vectors and/or the data values they contain—to determine whether particular features occur in them in each case, which indicate an increased likelihood of faults or failure in the tested semi-conductor components 3a, 3b, 3c, 3d.

After the above first phase ("learning phase")—more closely described below by means of an example—it can be decided—by the above pattern recognition system—with a high degree of probability—in a second phase (in particular after the actual start of component manufacturing, for instance after introducing new technology (i.e. during "normal" manufacture)) based solely on data $D_{A1}$, $D_{B1}$ $D_{A2}$, $D_{B2}$, $D_C$, $D_D$, $D_E$, $D_F$ measured in each case (i.e. on the feature vector determined in each case)(i.e. without fault analysis, in particular without separate compilation of fault analysis data $D_G$) of the presence of corresponding faults in relation to a particular semi-conductor component 3a (and/or a particular group of semi-conductor components 3a, 3b, 3c, 3d, a particular wafer 2, a particular batch etc.), in fact by examining the above data $D_{A1}$, $D_{B1}$, $D_{A2}$, $D_{B2}$, $D_C$, $D_D$, $D_E$, $D_F$—corresponding to the results obtained in the above "learning phase"—for patterns (where necessary those obtained above) indicating the presence of particular faults.

With the above pattern recognition system the data evaluation (here: the above pattern recognition) can—in the second phase (for instance during normal manufacture)—indicate problems in the manufacturing process, even before an increased failure rate indicates the need for targeted analysis.

For the above pattern recognition a knowledge of the physical causes of the interdependence between particular measurement result combinations (and/or particular patterns in the data $D_{A1}$, $D_{B1}$, $D_{A2}$, $D_{B2}$, $D_C$, $D_D$, $D_E$, $D_F$ and/or data values in each pattern recognition feature vector) and related failure mechanisms is not obligatory; instead this interdependence can be empirically determined in each case.

Below a—considerably simplified—example is briefly explained for a better understanding of the above: in the learning phase for instance a fault is determined in numerous semi-conductor components (wafers, batches, etc.)—during a particular test, for instance a conclusive single-fault test, for instance an AC function test (and/or a function test during a later phase of the semi-conductor component manufacturing process).

During preceding individual DC and/or kerf tests (single-fault tests) the currents (voltages) measured during the tests of the corresponding semi-conductor components (wafers, batches, etc.) fell within the critical values acceptable for an individual test.

By means of the above pattern recognition it could be determined—empirically—that whenever a particular measured current (or a particular measured voltage) was particularly high (although still within accepted critical limits) during a first, initial test (DC and/or kerf test), and at the same time that a current (or a particular voltage) measured simultaneously at a second initial test, (a DC and/or kerf test), was also particularly high (or for instance particularly low) (faulty pattern), increased failures would occur during the above—conclusive—functional test.

A similar fault pattern—and/or further (possibly considerably more complicated) fault patterns—can be automatically recognized (as described above) by the above pattern recognition system—during the above first phase (learning phase)—by means of an appropriate pattern recognition process.

After the learning phase (i.e. during the above second phase) the pattern recognition system correspondingly recognizes (and/or re-recognizes) feature patterns (for instance, as explained above, a relatively high value in a current (and/or voltage)—measured during a first test—and coincidentally a relatively high (or low) value in a current (and/or voltage)—measured during a second test) with a relatively high probability of leading to a fault, and allocates these patterns to the corresponding fault mechanism with the corresponding probability.

In reaction to this (and/or in reaction to identifying one or more feature combinations (drawing attention to themselves as probably more likely to fail)) the computer installation 1 (or alternatively the test apparatus 6) can—automatically—incorporate an appropriate adjustment into the process parameters used during the manufacture of semi-conductor components (for instance an adjustment to the corresponding process parameters for the above coating, exposure, etching, diffusion and/or implantation process steps, etc.), in fact by sending appropriate process control data K from the computer installation 1 (or alternatively from the test apparatus 6) (here: via a line 50) to a process control device that institutes a change in the process parameters.

Hereby an increased yield can be achieved during the manufacture of semi-conductor components.

What is claimed is:

1. A method for testing semiconductor components, comprising:
   a training phase, comprising,
      performing a first training test on a plurality of semiconductor devices to obtain first training test result data,
      performing a second training test on the plurality of semiconductor devices to obtain second training test result data,
      performing a third training test on the plurality of semiconductor devices to obtain third training test result data, and
      analyzing the first training test result data, the second training test result data and the third training test result data to determine a pattern for semiconductor devices in which the first training test result data and the second training test result data indicate an acceptable semiconductor device and the third training result data indicates a failed semiconductor device, and
   a testing phase, comprising,
      performing a first test on a semiconductor device to obtain first test result data,
      performing a second test on the semiconductor device to obtain second test result data, and using a microprocessor based device to analyze the first test result data and the second test result data to predict if the semiconductor device would pass a third test based on the pattern determined in the training phase.

2. A system for testing semiconductor components, comprising:
   a testing device,
      to perform a first training test on a plurality of semiconductor devices to obtain first training test result data,
      to perform a second training test on the plurality of semiconductor devices to obtain second training test result data,
      to perform a third training test on the plurality of semiconductor devices to obtain third training test result data, and
      to analyze the first training test result data, the second training test result data and the third training test result data to determine a pattern for semiconductor devices in which the first training test result data and the second training test result data indicate an acceptable semiconductor device and the third training result data indicates a failed semiconductor device,
      to perform a first test on a semiconductor device, after the pattern is determined, to obtain first test result data, and
      to perform a second test on the semiconductor device, after the pattern is determined, to obtain second test result data, and
   a microprocessor based device to analyze the first test result data and the second test result data to predict if the semiconductor device would pass a third test based on the determined pattern.

3. A method for testing semiconductor components, comprising:
   a training phase, comprising:
      performing a first training test on a plurality of semiconductor components to obtain first training test result data;
      performing a second training test on the plurality of semiconductor components to obtain second training test result data;
      performing a third training test on the plurality of semiconductor components different from the first and second training test to obtain third training test result data; and
      jointly analyzing the first training test result data, the second training test result data and the third training test result data to determine a pattern indicating an increased likelihood of a fault; and
   a test phase, comprising:
      performing a first test on a semiconductor component to obtain first test result data;
      performing a second test on the semiconductor component to obtain second test result data; and
      jointly analyzing the first and second test result data to predict whether the semiconductor component would pass a third test different from the first and second test based on the pattern determined in the training phase.

4. The method of claim 3, wherein the step of jointly analyzing the first and second test result data comprises:
   determining whether the first and second test result data are mutually correlated.

* * * * *

UNITED STATES PATENT AND TRADEMARK OFFICE
CERTIFICATE OF CORRECTION

PATENT NO. : 7,230,442 B2
APPLICATION NO. : 10/860594
DATED : June 12, 2007
INVENTOR(S) : Müller et al.

It is certified that error appears in the above-identified patent and that said Letters Patent is hereby corrected as shown below:

Column 4, line 11: Replace "card, 18" with --card 18,--;
Column 6, line 42: Delete the second occurrence of "etc.";
Column 7, line 63: Delete the second occurrence of "etc.";
Column 9, line 36: Replace "batch etc." with --batch, etc.--;
Column 12, line 12: Replace "second training test" with --second training tests--;
Column 12, line 27: Replace "second test" with --second tests--.

Signed and Sealed this

Second Day of October, 2007

JON W. DUDAS
*Director of the United States Patent and Trademark Office*